United States Patent [19]
Shibata

[11] Patent Number: 5,841,640
[45] Date of Patent: Nov. 24, 1998

[54] IC SOCKET

[75] Inventor: Sueji Shibata, Tokyo, Japan

[73] Assignee: Yamaichi Electronics Co., Ltd., Tokyo, Japan

[21] Appl. No.: 904,264

[22] Filed: Jul. 31, 1997

[30] Foreign Application Priority Data

Aug. 2, 1996 [JP] Japan .................................. 8-204994

[51] Int. Cl.⁶ .......................... H05K 01/18; H01R 09/09
[52] U.S. Cl. ......................... 361/820; 361/820; 361/679; 361/683; 439/66; 439/73; 439/68; 439/69; 439/74; 439/67; 439/72; 439/71; 439/70
[58] Field of Search ............................... 439/66, 266, 73, 439/68, 69, 74, 67, 72, 71, 70; 361/820, 679, 683

[56] References Cited

U.S. PATENT DOCUMENTS

| | | | |
|---|---|---|---|
| 4,758,176 | 7/1988 | Abe et al. | 439/331 |
| 5,244,404 | 9/1993 | Kishi et al. | 439/331 |
| 5,447,448 | 9/1995 | Noriyuki | 439/331 |
| 5,628,645 | 5/1997 | Matsuoka et al. | 439/331 |
| 5,683,262 | 11/1997 | Matsuoka et al. | 439/266 |
| 5,697,795 | 12/1997 | Abe | 439/73 |

FOREIGN PATENT DOCUMENTS 5-174880  7/1993  Japan .

*Primary Examiner*—Leo P. Picard
*Assistant Examiner*—David Foster
*Attorney, Agent, or Firm*—Wenderoth, Lind & Ponak, L.L.P.

[57] ABSTRACT

An IC socket comprises a socket body including a plurality of contacts for interconnecting an IC and a wiring board. Each of the contacts comprises a contacting arm including an upper end contact portion for a lead of an IC to overlie and contact, and a lower end contact portion including a downwardly facing projection capable of abutting with a wiring portion of the wiring board, and a pressing element projecting backwardly of the contacting arm from an area in the vicinity of a connecting portion between the projection and the contacting arm. The projection forming the lower end contact portion is received in an upwardly and downwardly open through-hole formed in the socket body, so as to be subjected to abutment with the wiring portion. A resilient body held by the socket body is interposed between the pressing element and the contacting arm to retain a standby posture of the contact, and the contact is turned forwardly about the projection received in the through-hole to thereby cause the pressing element to compress the resilient body, so that a contacting pressure between the upper end contact portion of the contacting arm and the IC lead is obtained by a restoring force of the resilient body.

21 Claims, 6 Drawing Sheets

IC SOCKET

BACKGROUND OF THE INVENTION

This invention relates to an IC socket serving as a contacting medium between an IC and a wiring board, and more particularly to an IC socket which can be advantageously utilized as a counter-measure of low inductance.

Recently, the operation signal of IC have become higher and higher in frequency. With this tendency, improvement is required of the IC socket to accomodate this high-frequency characteristic. In order to improve the IC socket, in this regard it is necessary for the contacts of the IC socket to be such as to reduce the length of the signal paths as much as possible. On the contrary, the contact are required to be constructed to be able to be resiliently contacted with the IC lead under pressure. For example, when a contact of the type including a spring portion is blanked out of a metal material, there is a limitation to reducing the length of the spring portion, namely, the length of the signal path because of the characteristic that the contact must be able to contact the lead under pressure. For this reason, it is difficult for this type of contact to achieve the required low inductance.

Japanese Laid-Open Patent Application No. 5(1993)-174880 (Patent Application No. 4(1992)-38865) discloses a contact of the type in that a contact arm constituting the contact is provided at each of the opposite ends thereof with a hook portion for catching a column-like rubber piece disposed across a socket body, so that the contact will be held in a correct location of the socket body in a standby posture (normal posture).

Although it is possible for the above contact to be such as to reduce the length of the signal path from the IC lead to the wiring board, two hooks are required to be formed on each of the opposite ends of the contact and, in addition, the contact is required to have two column-like rubber pieces. Moreover, the contact must be assembled in a bridge-like style by bringing each hook into engagement with the corresponding column-like rubber piece. Accordingly, the assembling work is complicated and requires much time and labor. As a consequence, productivity is lowered and costs are increased. Furthermore, in the above-mentioned prior art devices, deterioration in the resiliency occurs for each rubber piece which results in loss of reliability in the early stages.

The present invention has been accomplished in view of the above-mentioned problems inherent in the prior art devices.

SUMMARY OF THE INVENTION

It is, therefore, an object of the present invention to provide an IC socket which is simple in construction, easy to manufacture, easy to assemble, low in cost and high in performance.

It is another object of the invention to provide an IC socket, in which the required low inductance of the contact can be achieved.

To achieve the above objects, a contact according to the present invention comprises a contacting arm including an upper end contact portion for a lead of an IC to overlie and contact, and a lower end contact portion including a downwardly facing projection capable of abutting with a wiring portion of a wiring board, and a pressing element projecting backwardly of the contacting arm from an area in the vicinity of a connecting portion between the projection and the contacting arm.

The contact comprising the contacting arm, the pressing element, and the projection is of a rigid construction, having no spring portion. The projection of the contact of the above-mentioned rigid construction is received in a through-hole formed in the socket body and opened upwardly and downwardly, so as to be abutted with the wiring board. A resilient body is interposed between the pressing element and the contacting arm. Owing to this arrangement, the standby posture of the contact can be retained.

More specifically, the standby posture of the contact can be retained by receiving the contacting arm and the downwardly facing projection in the through-hole such that the contacting arm and the pressing element are supported by the resilient body.

The contact is turned forwardly about the projection received in the through-hole. This forward turning motion of the contact causes the pressing element to compress the resilient body. A contacting pressure between the upper end contact portion of the contacting arm and the IC lead is ensured by the restoring force of the resilient body. The resilient body may include rubber, an air tube, a liquid tube, or the like.

Also, the projection is pushed up within the through-hole by a wiring portion of the wiring board to cause the pressing element and the contacting arm to move upwardly to form a primary compressed state of the resilient body, so that a pressure contacted state between the projection and the wiring board is realized by the restoring force of the primarily compressed resilient body.

Furthermore, the upper end contact portion is pushed down by the IC lead to cause the contacting arm and the pressing element to turn forwardly about the projection to form a secondary compressed state of the resilient body, so that a pressure contacted state between the upper end contact portion and the IC lead is realized by the restoring force of the secondarily compressed resilient body.

As one example, the resilient body is formed into a square shape in section so that the pressing element and the contacting arm are supported by two adjacent angular portions of the resilient body. The resilient body may be of a hollow construction.

Also, the resilient body may be provided with a plurality of protrusions so that the pressing element and the contacting arm are supported by the protrusions. The pressing element may project into the interior of the resilient body. Preferably, the upper end opening portion of the through-hole is enlarged upwardly, the contacting arm extends along one inclination surface forming the enlarged opening, and the pressing element extends along the other inclination surface.

A correct standby posture of the contact can be held in the socket body by the projection being inserted into the through-hole and the resilient body. In addition, by providing only one resilient body, the number of component parts can be reduced, the assembly can be greatly simplified, and a cost reduction can be achieved.

The above and other objects, characteristic features and advantages of the present invention will become more manifest to those skilled in the art by the following description of the preferred embodiment of the present invention, as illustrated in the accompanying drawings.

DETAILED DESCRIPTION OF THE EMBODIMENT

One preferred embodiment of an IC socket of the present invention will now be described in detail with reference to the accompanying drawings.

Figure 1:
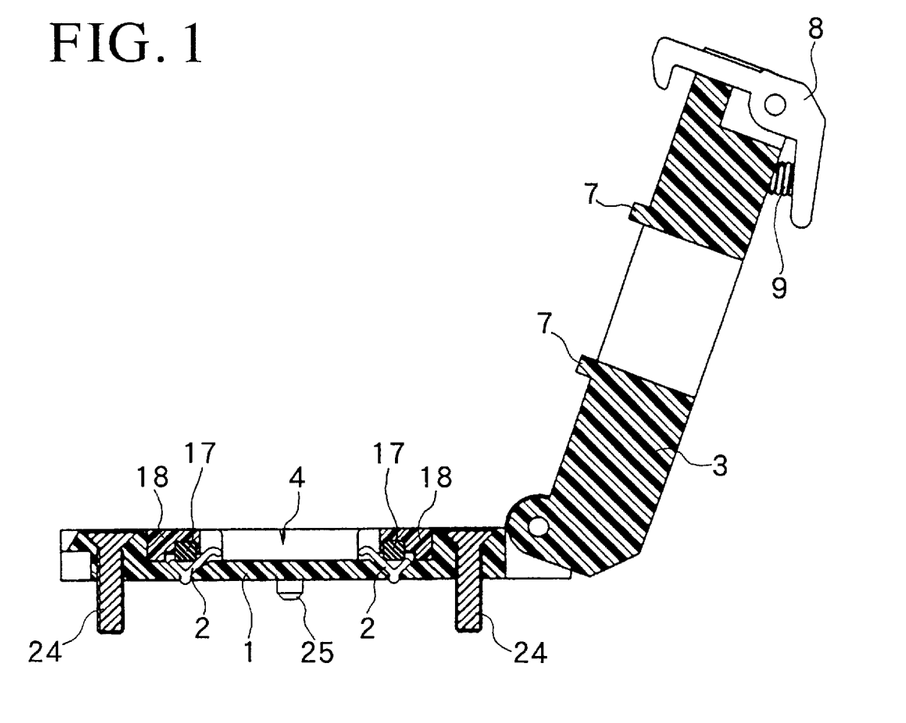
FIG. 1 is a sectional view of an IC socket according to one embodiment of the present invention.

As shown in FIG. 1, an IC socket comprises a generally rectangular socket body 1 made of insulative material, and an IC presser cover 3 attached to the socket body 1 such that the cover 3 can be opened and closed relative to the socket body 1.

Figure 3:
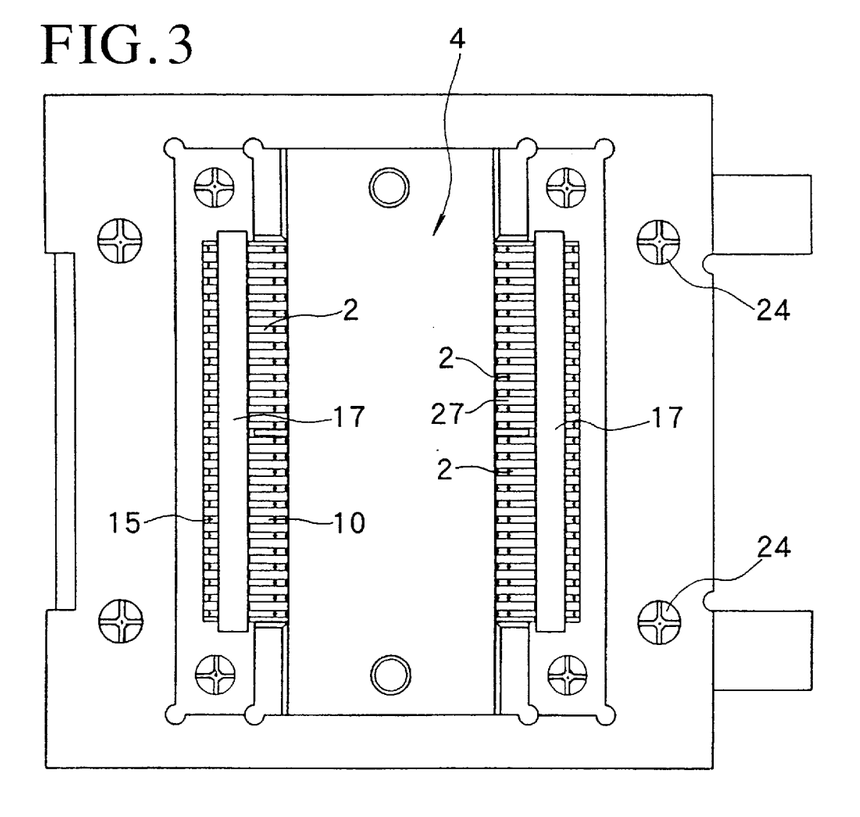
FIG. 3 is a plan view of a socket body in the IC socket of FIG. 1.
Figure 4:
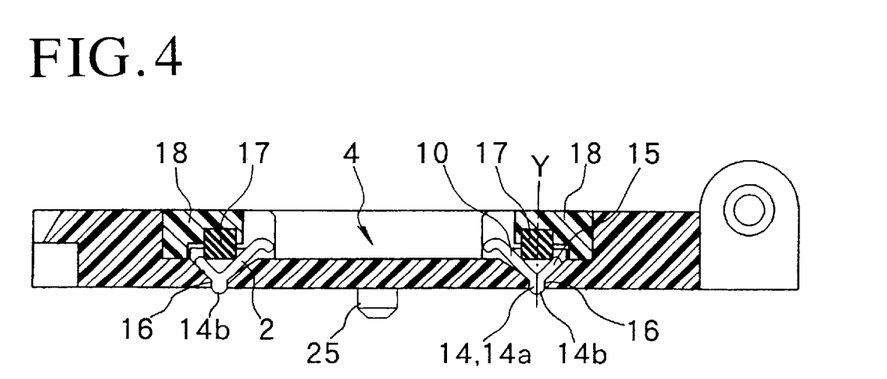
FIG. 4 is a sectional view of the socket body.

As shown in FIGS. 1, 3 and 4, the socket body 1 is provided at a central portion thereof with an IC receiving portion 4 which is open at an upper surface of the IC receiving portion 4. The socket body 1 includes a plurality of contacts 2 which are arranged in array along two or four opposing sides of the IC receiving portion 4.

Figure 2:
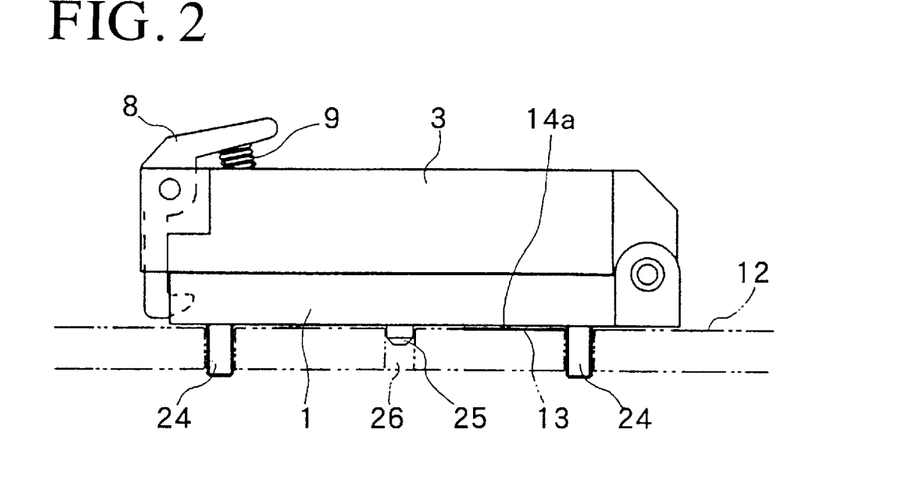
FIG. 2 is a side view of the IC socket of FIG. 1.

The IC presser cover 3 is a means for pressing an IC lead 6 of an IC 5 received in the IC receiving portion 4 against the corresponding contact 2 when the IC presser cover 3 is closed relative to the socket body 1 as shown in FIG. 2. A pad 7 for pressing the IC lead 6 is provided on an inner surface of the IC presser cover 3.

Reference numeral 8 denotes a lock lever for retaining a closed state of the presser cover 3. As shown in FIG. 1, the lock lever 8 is turnably attached to a free end of the presser cover 3 and biased in an engagement direction by a spring 9. By this biasing force, the lock lever 8 is brought into engagement with an end portion of the socket body 1. It is also an interesting alternative that the lock lever 8 can be turnably attached to one end of the socket body 1 and biased in an engagement direction, so that the lock lever 8 is brought into engagement with a free end of the presser cover 3. It is also accepted that the presser cover 3 can be provided separately from the socket body instead of being turnably attached to the socket body 1.

As shown in FIGS. 1 and 4, the contact 2 includes a contacting arm 10 inclining towards the IC receiving portion 4, an upper end contact portion 11 for the IC lead 6 to overlie and contact, provided on an upper end of the contacting arm 10, and a lower end contact portion 14 which can be brought into abutment with a wiring portion 13 of a wiring board 12. The lower end contact portion 14 consists of a projection 14a projecting downwardly so as to abut with the wiring board 12 at a generally vertical angle. Therefore, an opening angle α1 formed by the projection 14a and the contacting arm 10 is smaller than 180 degrees.

The contact 2 further includes a pressing element 15 projecting backwardly of the contacting arm 10 (e.g. see FIGS. 7–11) from an area in the vicinity of a connection portion between the projection 14a and the contacting arm 10. An opening angle α2 formed by the pressing element 15 and the contacting arm 10 is smaller than the opening angle α1. As one example, α2 is approximately 90 degrees.

The contact 2 has an opening angle α3 formed by a vertical line Y passing through the projection 14a and the contacting arm 10 and another opening angle α3 formed by the vertical line Y and the pressing element 15. As one example, those angles α3 are approximately 30 degrees to approximately 50 degrees, respectively.

Each of the contacting arm 10, the projection 14a and the pressing element 15 is rigid, and they are integrally blanked out of a plate material to thereby form the rigid contact 2.

As shown in FIGS. 1 and 4, the projection 14a forming the lower end contacting portion 14 is received in the through-hole 16 formed in the socket body 1 and opening upwardly and downwardly, so as to be abutted with the wiring portion 13.

As shown in FIG. 4, the upper end opening portion of the through-hole 16 is enlarged upwardly, a basal portion of the contacting arm 10 extends along one inclination surface 16b forming the enlarged opening 16a, and the pressing element 15 extends along the other inclination surface 16c.

The projection 14a can move upwardly and downwardly, guided by the through-hole 16. As a consequence, the contacting arm 10 and the pressing element 15 can move upwardly and downwardly.

The contacting arm 10 and the pressing element 15 can turn forwardly and backwardly about the projection 14a which is received in the through-hole 16.

More specifically, the socket body 1 is placed on the wiring board 12. When the projection 14a is pushed up by the wiring portion 13 of the wiring board 12, the contacting arm 10 and the pressing element 15 are moved away from the inclination surfaces 16b and 16c and allowed to turn forwardly and backwardly within a range restricted by the inclination surfaces 16b and 16c. An insulative partition wall 27 provided on the socket body 1 is interposed between each adjacent pair of contracts 2. The contact portions 11 of the contacting arms 10 project upwardly between the partition walls 27.

A resilient body 17 is interposed between the pressing element 15 and the contacting arm 10 to support the pressing element 15 and the contacting arm 10. At this time, the pressing element 15 and the contacting arm 10 can be resiliently pressed downwardly by the resilient body 17.

A standby posture of the contact 2, namely, a standby posture of the contact 2 before the IC lead 6 contacts under pressure the upper end contact portion 11 of the contact 2, is retained by interposing the resilient body 17 between the pressing element 15 and the contacting arm 10 and inserting the projection 14a into the through-hole 16.

More specifically, by inserting the projection 14a of the contact 2 in the through-hole 16, the entire contact, namely, the locations of the contacting arm 10 and the pressing element 15 are established and the contacting arm 10 and the pressing element 15 are restricted from turning forwardly and backwardly by the resilient body 17, thereby retaining the above-mentioned standby posture of the contact 2.

The resilient body 17 may be rubber, an air tube, a liquid tube or the like. The resilient body 17 may also be made of synthetic resin material.

Figure 6:
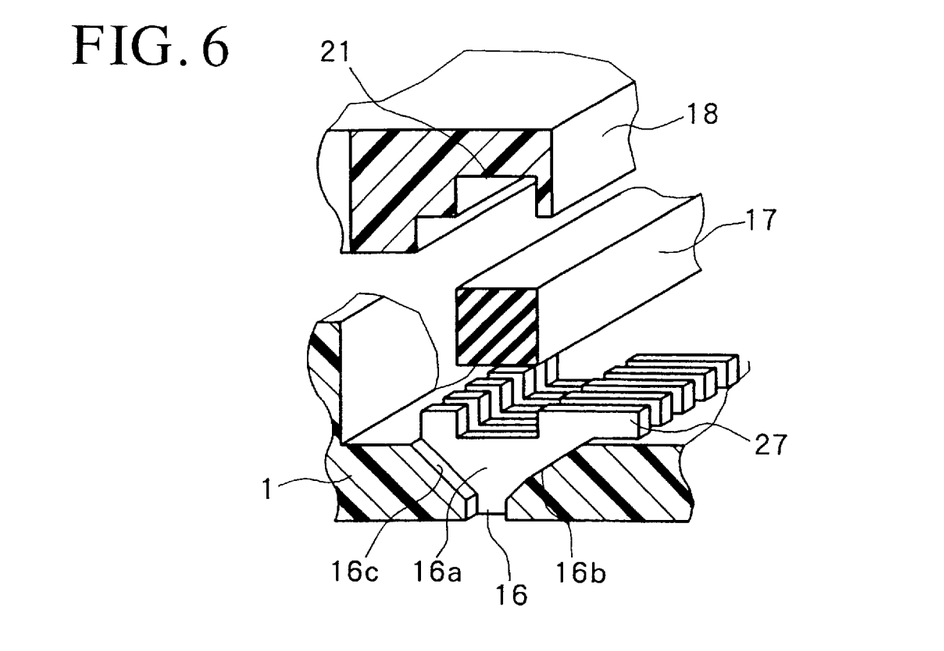
FIG. 6 is a perspective view of a main portion, showing, in an exploded state, a construction of assembly of a resilient body with respect to the socket body.
Figure 7:
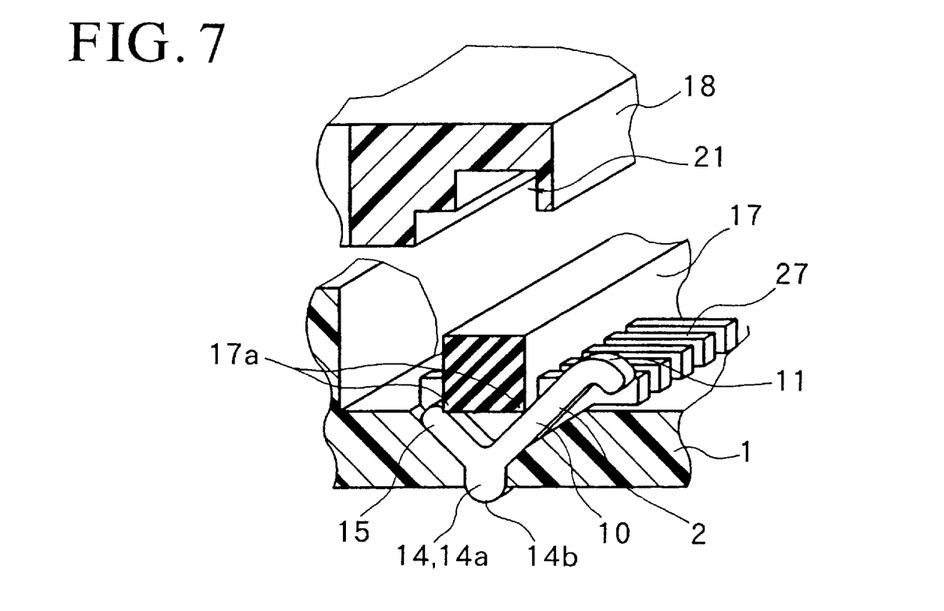
FIG. 7 is a perspective view of a main portion of FIG. 6, but with a contact attached thereto.

As shown in FIG. 3, as well as elsewhere, the resilient body 17 is of a column-like configuration extending in the direction of array of the contacts 2. The resilient body 17 is provided on the socket body 1. As one example, as shown in FIGS. 4, 6 and 7, as well as elsewhere, an attaching groove 21 is formed in a lower surface of a column-like holder 18 in the longitudinal direction. An upper portion of the column-like resilient member 17 is held within the attaching groove 21. Each column-like holder 18 is fixedly attached to the socket body 1 such that the holders 18 extends along respective sides of the IC receiving portion 4. By doing so, the column-like resilient body 17 projecting in the longitudinal direction from the lower surface of the holder 18 is interposed between the contacting arm 10 and the pressing element 15 to support the contacting arm 10 and the pressing element 15.

The column-like holder 18 is fixedly attached at opposite ends thereof to the socket body 1 by screw means. In that fixedly attached state of the column-like holder 18, the contacting arm 10 and the pressing element 15 are supported by the resilient body 17. At this time, a pushing down force is exerted to the contacting arm 10 and the pressing element 15 by the resilient force of the resilient body 17, so that the above-mentioned standby posture is formed.

As shown in FIGS. 1 and 4, as well as elsewhere, the contacting arm 10 and the pressing element 15 are restricted from moving upwardly by the resilient body 17. By this restriction, the lower end portion of the projection 14a protrudes downwardly of the through-hole 16. The downwardly protruded portion 14b is contacted under pressure with the wiring portion 13 of the wiring board 12.

Figure 5A:
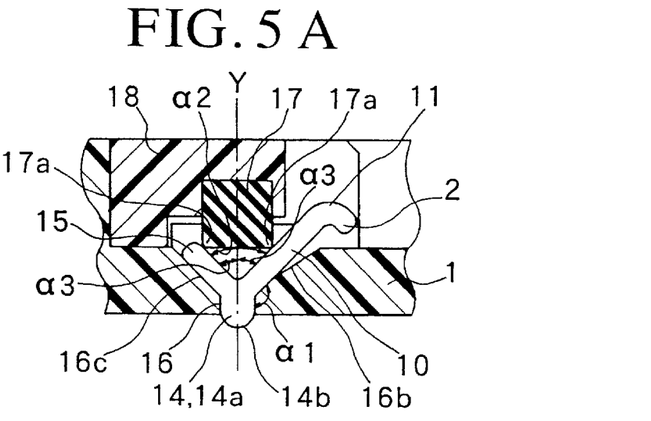
FIGS. 5(A), 5(B) and 5(C) are sectional views of a main portion, sequentially showing the motion of the contact and the resilient body in the IC socket.
Figure 5B:
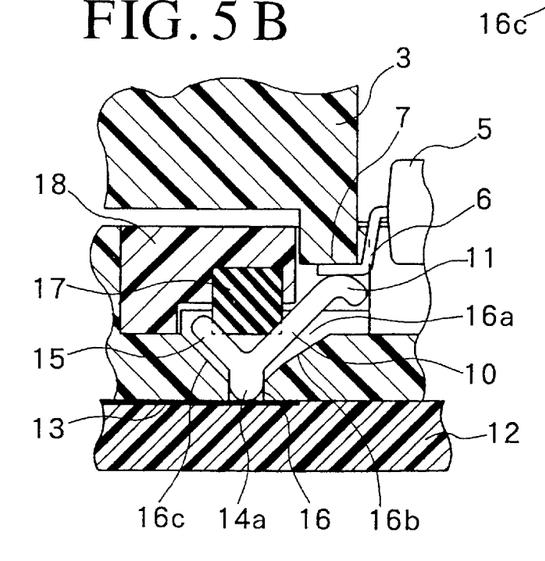
Figure 5C:
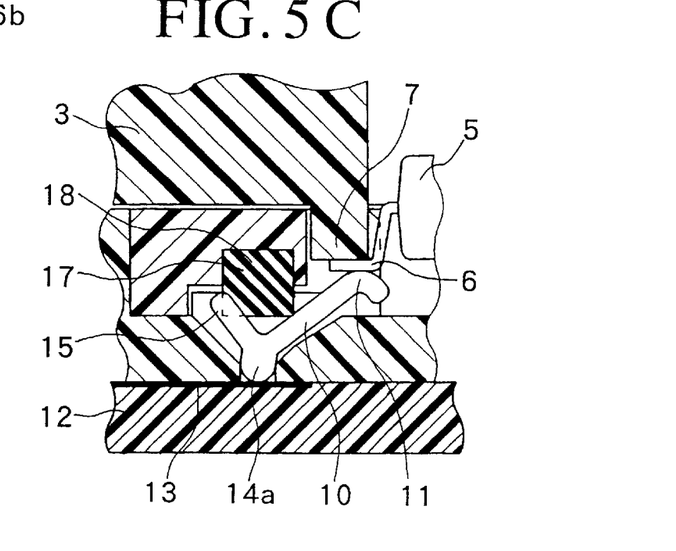

As shown in FIGS. 1, 4 and 5, the resilient body 17 is formed into a square column-like configuration. The pressing element 15 and the contacting arm 10 are supported by two adjacent angular portions 17a of the lower surface of the resilient body 17.

Figure 8:
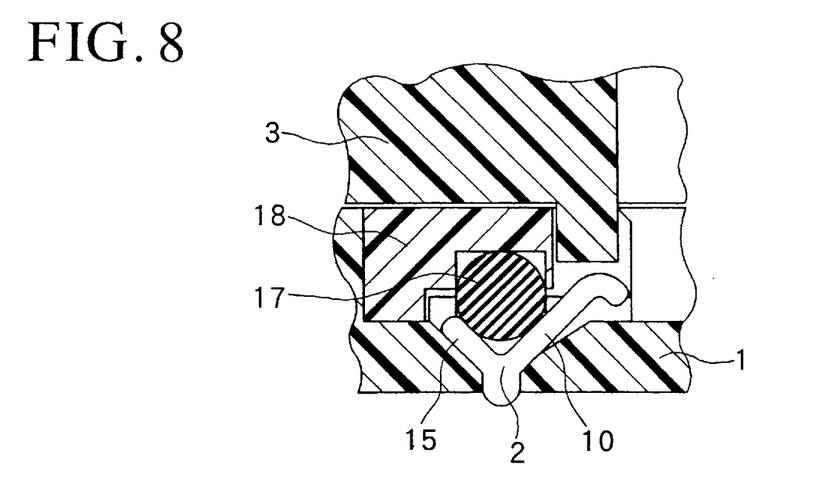
FIG. 8 is a sectional view of a main portion of an IC socket of the present invention, showing another example of a resilient body.

As shown in FIG. 8, the resilient body 17 may be formed into a circular column-like configuration. In this case, the pressing element 15 and the contacting arm 10 are supported by two opposing surface portions of a lower circumferential surface of the resilient body 17.

Figure 9:
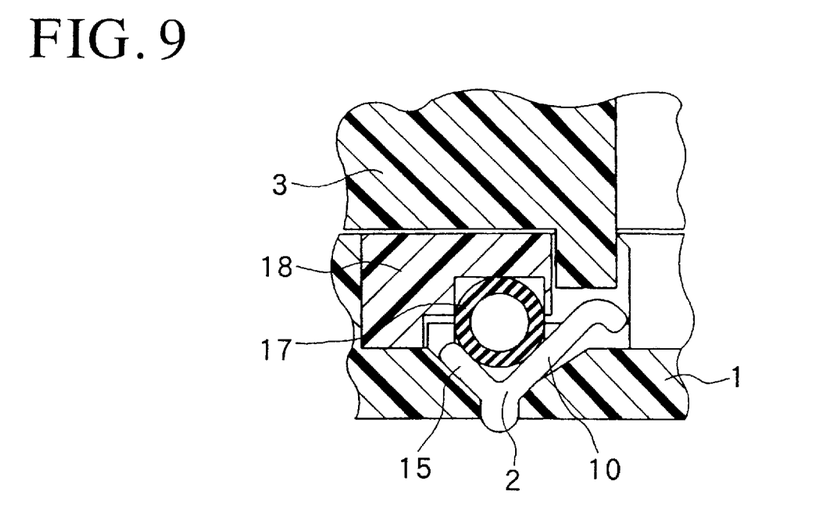
FIG. 9 is a sectional view of a main portion of an IC socket of the present invention, showing a further example of the resilient body.

As shown in FIGS. 4 and 8, the square or circular column-like resilient body 17 may be of a non-hollow construction (solid construction). It is also a contemplated interested alternative that the resilient body can be of a hollow construction as shown in FIG. 9.

Although not shown, in case an air tube or a liquid tube is used as the resilient body 17, the resilient body 17 is formed in a hollow construction so that air or liquid can be sealed within the synthetic resin or rubber tube.

If a square column-like or circular column-like rubber tube or synthetic resin tube is used as the resilient body 17, a hollow tube with opposite ends thereof open can be used.

Figure 10:
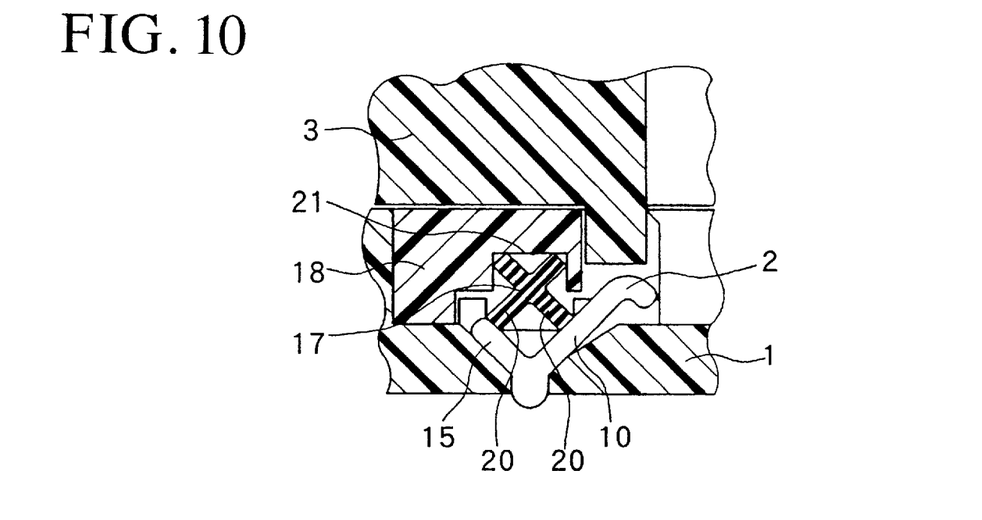
FIG. 10 is a sectional view of a main portion of an IC socket of the present invention, showing a still further example of the resilient body.

FIG. 10 shows another example, in which the resilient body 17 is provided with a plurality of protrusions 20, so that the pressing element 15 and the contacting arm 10 are supported by those protrusions 20. The protrusions 20 consist of ribs extending in the longitudinal direction of the resilient body 17, namely, ribs extending in parallel relation to the direction of the array of the contacts 2. The ribs are partly retained within the attaching groove 21 of the holder 18, and the contacting arm 10 and the pressing element 15 are supported by the rest of the ribs. The resilient body 17 using the ribs can be deformed resiliently only at its portion where the pressing element 15 comes into abutment. Thus, the resilient body 17 is easily resiliently deformed. This feature is likewise applicable to the construction in which the square column-like resilient body 17 is used and the contacting arm 10 and the pressing body 15 are supported by its angular portions.

Figure 11:
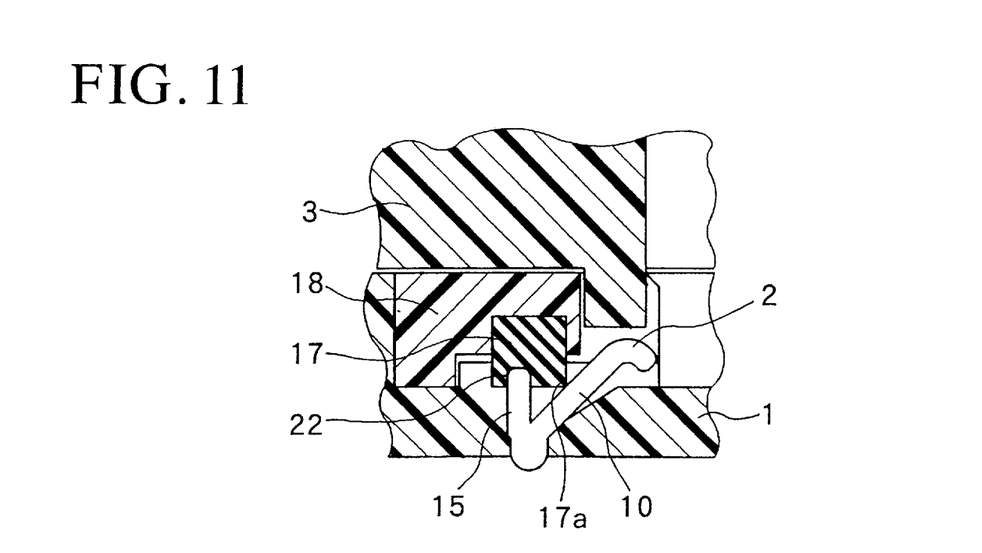
FIG. 11 is a sectional view of a main portion of an IC socket of the present invention, showing a yet further example of the resilient body.

FIG. 11 shows another example, in which the pressing element 15 projects into the interior of the resilient body 17. With the feature that the pressing element 15 projects into the interior of the resilient body 17, the entire contact, namely a standby posture of the contacting arm and the pressing element 15 can be held in a more reliable manner. Moreover, no play is formed between the pressing element 15 and the resilient body 17. Accordingly, the pressing element 15 and the resilient body 17 can be intimately connected together to provide a favorable result.

In FIG. 11, an attaching groove 22 is formed in a lower surface of the square column-like resilient body 17 in the longitudinal direction. A distal end of the pressing element 15 is press fitted in this groove 22 to intimately retain the pressing element 15 by the resilient force of the resilient body 17. The contacting arm 10 is in contact with an angular portion 17a of the resilient body 17. The pressing element 15 can, of course, be projected into the interior of the circular column-like resilient body 17. As shown in FIG. 11, in the case of the pressing element 15 projecting into the interior of the resilient body 17, the pressing element 15 may be held in a generally vertical posture and is not limited in angle to within the afore-mentioned α3.

Operation of the contact 2 and the resilient body 17 will now be described with reference to FIGS. 5(A) through 5(C), with a view to making the construction more clearly understood.

FIG. 5(A) shows a standby posture in which the contact 2 is not in contact with the wiring board 12 and the IC 15. As illustrated, the contacting arm 10 and the pressing element 15 of the contact 2 are abutted with and supported by the inclination surfaces 16b, 16c of the enlarged opening 16a of the through-hole 16, and the projection 14 is received in the through-hole 16. In that state, the resilient body 17 is abutted with and supports the contacting arm 10 and the pressing element 15 at location opposite to the projection. By this, a lower end of a projection 14a forming the lower end contacting portion 14 is allowed to project downwardly from the through-hole 16.

As shown in FIG. 5(B), the socket body 1, which is now in the state of FIG. 5(A), is placed on the upper surface of the wiring board 12.

By doing so, the protrusion 14b of the projection 14a is pushed up by the wiring portion 13 of the wiring board 12. The protrusion 14b is pushed up while guided by the through-hole 16. As a consequence, the contacting arm 10 and the pressing element 15 are also integrally pushed up to cause the resilient body 17 to be primarily compressed. As a reaction of this primary compression, a pushing-down force is applied to the contacting arm 10 and the pressing element 15 and projection 14a. By this pushing-down force, the projection 14a is caused to contact under pressure the wiring portion 13 of the wiring board 12. As a reaction of this primary compression, the contact 2 is resiliently held between the resilient body 17 and the wiring board 12, so that a more reliable standby posture of the contact 2 with respect to the IC can be obtained.

FIGS. 5A–C show a representative example in which a square column-like resilient body 17 is used. In this case, each angular portion 17a of the square column-like resilient body 17 is compressed by the contacting arm 10 and the pressing element 15.

In order to retain a superposed relation between the wiring board 12 and the socket body 1, the socket body 1 is tightened at required places by screws 24, for example, as shown in FIGS. 1 and 2. Also, the socket body 1 is provided with a plurality of positioning pins 25 projecting from a lower surface thereof, and the positioning pins 25 are inserted into positioning holes 26 formed in the wiring board 12 to bring the projection 14a and the wiring portion 13 into corresponding relation to each other. Thereafter, the screws 24 are tightened.

Then, as shown in FIG. 5(B), the IC 5 is received in the IC receiving portion 4, and the IC lead 6 is placed on the upper end contact portion 11 provided on the free end of the contacting arm 10. Thereafter, the presser cover 3 is closed, and the lock lever 8 is brought into engagement with the socket body 1 as shown in FIGS. 2 and 5(C), so that the closed relationship is retained.

The closing of the presser cover 3 causes the pressing pad 7 projecting from an inner surface of the cover 3 to push down the IC lead 6 and the upper end contact portion 11. This causes the contacting arm 10 and the pressing element 15 to turn forwardly and downwardly about the projection 14a. As a consequence, the pressing element 15 secondarily compresses the primarily compressed resilient body 17. As a reaction thereof, the upper end contacting portion 11 is caused to contact under pressure the IC lead 6. By doing so, the shortest length of a signal path is formed by the contacting arm 10 extending between the upper end contact portion 11 and the projection 14a of the lower end contact portion 14.

As shown in FIGS. 5(B) and 5(C), when the wiring board 12 pushes up the projection 14a, the contacting arm 10 and the pressing element 15 are caused to be pushed up so as to be moved away from the inclination surfaces 16b, 16c of the enlarged opening 16a. By this movement away from the inclination surfaces 16, 16c, the contacting arm 10 is turned forwardly. The contacting arm 10 is allowed to turn forwardly until it is brought into abutment with the inclination surface 16b.

According to the present invention, a standby posture of the contact can be retained in a more reliable manner through cooperative action between only one resilient body interposed between the contacting arm and the pressing element and the projection received in the through-hole. Further, the assembling work of the resilient body and the contact can be simplified compared with the prior art device in which the standby posture of the contact is retained by bringing the opposite ends of the contact into engagement with two resilient bodies. Thus, the number of the resilient bodies can be reduced and a cost reduction can be achieved.

Furthermore, according to the present invention, the adverse effect caused by shifting motion of the contact due to deterioration of the resilient body can be diminished by half.

While one preferred embodiment of an IC socket according to the present invention has thus far been described with reference to the drawings, it should be borne in mind that such embodiment is merely illustrative of the gist of the present invention and is accordingly subject to change and modification without departing from the scope of the subjoined claims.

What is claimed is:

1. An IC socket comprising a socket body including a plurality of contacts for interconnecting an IC and a wiring board;

said contacts each comprising a contacting arm including an upper end contact portion for a lead of an IC to overlie and contact, and a lower end contact portion including a downwardly facing projection capable of abutting with a wiring portion of said wiring board, and a pressing element projecting backwardly of said contact arm from an area in the vicinity of a connecting portion between said projection and said contacting arm:

said projection of said lower end contact portion being received in an upwardly and downwardly open through-hole formed in said socket body, so as to be subjected to abutment with said wiring portion, a resilient body held by said socket body being interposed between said pressing element and said contacting arm to retain a standby posture of said contact; and said contact being turned forwardly about said projection received in said through-hole to thereby cause said pressing element to compress said resilient body, so that a contacting pressure between said upper end contact portion of said contacting arm and said IC lead is obtained by a restoring force of said resilient body.

2. An IC socket according to claim 1, wherein said projection is pushed up by said wiring portion of said wiring board within said through-hole to cause said pressing element and said contacting arm to move upwardly so that a primary compressed state of said resilient body is formed, and a pressure contacted state between said projection and said wiring portion is formed by a restoring force of said primarily compressed resilient body, and said upper end contact portion is pushed down by said IC lead to cause said contacting arm and said pressing element to turn forwardly about said projection to form a secondary compressed state of said resilient body, so that a pressure contacted state between said upper end contact portion and said IC lead is formed by a restoring force of said secondarily compressed resilient body.

3. An IC socket according to claim 1, wherein said resilient body exhibits a square shape in section, and said pressing element and said contacting arm are supported by two adjacent angular portions of said resilient body.

4. An IC socket according to claim 1, wherein said resilient body is of a hollow construction.

5. An IC socket according to claim 1, wherein said resilient body is provided with a plurality of protrusions, and said pressing element and said contacting arm are supported by said protrusions.

6. An IC socket according to claim 1, wherein said pressing element projects into the interior of said resilient body.

7. An IC socket according to claim 1, wherein an upper end opening portion of said through-hole is enlarged upwardly, said contacting arm extends along one of two inclination surfaces which form said enlarged opening, and said pressing element extends along the other of said inclination surfaces.

8. An IC socket according to claim 2, wherein said resilient body is of a hollow construction.

9. An IC socket according to claim 3, wherein said resilient body is of a hollow construction.

10. An IC socket according to claim 2, wherein said resilient body is provided with a plurality of protrusions, and said pressing element and said contacting arm are supported by said protrusions.

11. An IC socket according to claim 3, wherein said resilient body is provided with a plurality of protrusions, and said pressing element and said contacting arm are supported by said protrusions.

12. An IC socket according to claim 4, wherein said resilient body is provided with a plurality of protrusions, and said pressing element and said contacting arm are supported by said protrusions.

13. An IC socket according to claim 2, wherein said pressing element projects into the interior of said resilient body.

14. An IC socket according to claim 3, wherein said pressing element projects into the interior of said resilient body.

15. An IC socket according to claim 4, wherein said pressing element projects into the interior of said resilient body.

16. An IC socket according to claim 5, wherein said pressing element projects into the interior of said resilient body.

17. An IC socket according to claim 2, wherein an upper end opening portion of said through-hole is enlarged upwardly, said contacting arm extends along one of two inclination surfaces which form said enlarged opening, and said pressing element extends along the other of said inclination surfaces.

18. An IC socket according to claim 3, wherein an upper end opening portion of said through-hole is enlarged upwardly, said contacting arm extends along one of two inclination surfaces which form said enlarged opening, and said pressing element extends along the other of said inclination surfaces.

19. An IC socket according to claim 4, wherein an upper end opening portion of said through-hole is enlarged upwardly, said contacting arm extends along one of two inclination surfaces which form said enlarged opening, and said pressing element extends along the other of said inclination surfaces.

20. An IC socket according to claim 5, wherein an upper end opening portion of said through-hole is enlarged upwardly, said contacting arm extends along one of two inclination surfaces which form said enlarged opening, and said pressing element extends along the other of said inclination surfaces.

21. An IC socket according to claim 6, wherein an upper end opening portion of said through-hole is enlarged upwardly, said contacting arm extends along one of two inclination surfaces which form said enlarged opening, and said pressing element extends along the other of said inclination surfaces.

* * * * *